Oct. 28, 1958 | A. P. STERN | 2,858,423

FEEDBACK CIRCUIT FOR SEMICONDUCTOR AMPLIFIERS

Filed Dec. 29, 1953

Inventor:
Arthur P. Stern,
by Charles M. Hutchins
His Attorney.

United States Patent Office 2,858,423

Patented Oct. 28, 1958

2,858,423

FEEDBACK CIRCUIT FOR SEMICONDUCTOR AMPLIFIERS

Arthur P. Stern, Syracuse, N. Y., assignor to General Electric Company, a corporation of New York Application December 29, 1953, Serial No. 400,855

6 Claims. (Cl. 250—20)

This invention relates to feedback circuits, and more particularly, to such circuits for semiconductor amplifiers.

Semiconductor amplifying devices, such as transistors, are well-known to perform functions somewhat similar to vacuum tubes. However, since the basic theories of operation of vacuum tubes and transistors are different, circuits employing transistors and vacuum tubes are not consistently correlative.

Feedback circuits for controlling the gain of an amplifier in accordance with the strength of the signal being amplified are well-known. Such circuits are employed in conjunction with vacuum-tube amplifiers for many purposes, such as volume expansion and compression and automatic gain control. Such feedback circuits are also desirable in semiconductor amplifiers to perform functions similar to those for which they are utilized in vacuum-tube amplifiers. However, because of the above-mentioned differences between vacuum tubes and semiconductor devices, feedback circuits of the types employed with vacuum tubes are not successful when applied to semiconductor devices.

Accordingly, it is the principal object of the present invention to provide an improved feedback circuit for amplifying circuits utilizing semiconductor devices as the active elements therein.

A more specific object of the present invention is to provide an improved automatic gain control circuit for a semiconductor amplifier.

The objects of the present invention may be realized through the provision of first and second semiconductor amplifying devices, together with means for deriving a direct voltage from said second semiconductor amplifying device and means for applying the derived direct voltage to the first amplifying device with polarity such that the desired feedback control is obtained.

Figure 1:
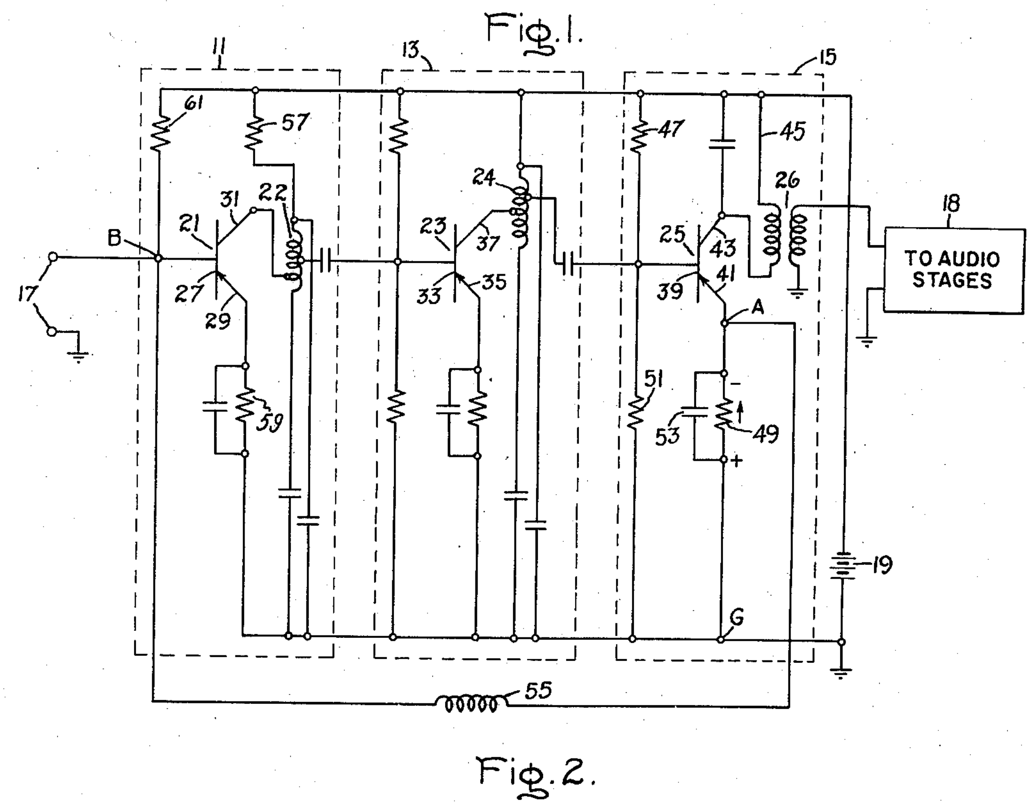
Figure 2:
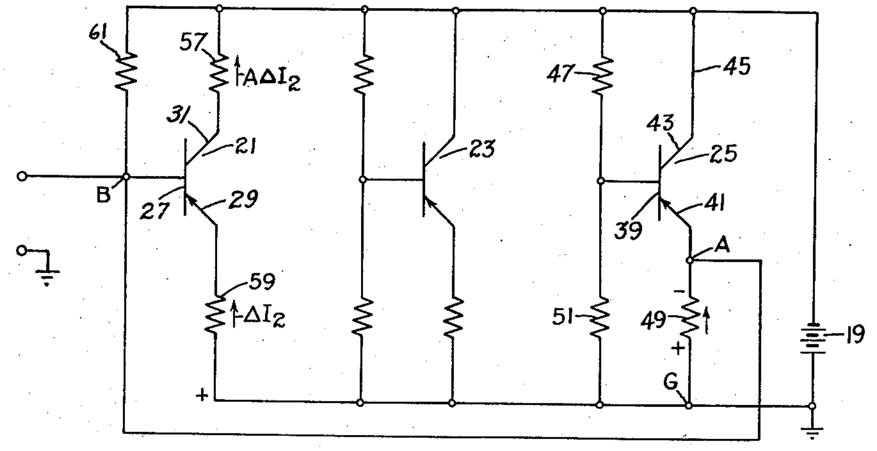

The features of this invention which are believed to be novel are set forth with particularity in the appended claims. The invention itself, however, both as to its organization and method of operation, together with further objects and advantages thereof, may best be understood by reference to the following description when taken in connection with the accompanying drawing wherein:

Fig. 1 is a schematic circuit diagram of an automatic gain control circuit embodying the principles of the present invention, and Fig. 2 is a D.-C. equivalent circuit diagram of the embodiment illustrated in Fig. 1.

Referring now to Fig. 1, an automatic gain control circuit utilizing the principles of the present invention is therein illustrated generally comprising three amplifying stages 11, 13, and 15. A signal is applied to stage 11 through input terminals 17 from a suitable signal source (not shown) or a previous stage, such as a radio-frequency amplifier stage (not shown). The output signal from stage 15 is connected to a suitable load, here shown as an audio output circuit 18. Although three stages 11, 13, and 15 are illustrated, as will hereinafter appear, the invention is not limited to three stages, but any number of stages may be utilized between stages 11 and 15. Further, the stages 11 and 15 may be coupled to each other with no intermediate stages being employed. The stages 11, 13, and 15 contain semiconductor amplifying devices 21, 23, and 25, respectively. Each of the devices 21, 23, and 25 has base, emitter, and collector electrodes; 27, 29, and 31, respectively, for the device 21; 33, 35, and 37, respectively, for the device 23; and 39, 41, and 43, respectively, for the device 25.

The preferred embodiment of the present invention is adapted for use in radio receivers, and hence, will be described in conjunction therewith. However, the invention is not limited to radio receivers, but in its broader aspects is applicable to other types of signal amplifiers.

As shown, each of the devices 21, 23, and 25 is a semiconductor device commonly denominated a junction transistor, and the preferred embodiment of the present invention is utilized in conjunction therewith. However, the invention is not restricted to junction transistors. For example, the present invention is applicable to circuits utilizing point-contact transistors and field-controlled semiconductor devices among others.

The stages 11, 13, and 15 are connected in cascade, the output signal from each of the stages 11, 13, and 15 being coupled to the subsequent stage by any convenient means, here shown as tuned transformers 22, 24, and 26. Bias is supplied to the electrodes of the transistors 21, 23, and 25 from a direct voltage source 19. As is well-known, the collector electrode of a transistor is biased in the reverse direction and the emitter electrode is biased in the forward direction relative to the base electrode of the transistor, where the terms "reverse direction" and "forward direction" are employed as they are normally used in the rectifier art.

As schematically illustrated, each of the transistors 21, 23, and 25 is a P–N–P transistor and therefore, the negative terminal of the source 19 is connected to the collector electrodes of the transistors 21, 23, and 25 to bias them in the reverse direction. The positive terminal of the source 19 is grounded. However, as is well-known, an N–P–N transistor can be readily utilized instead of a P–N–P transistor, the only change necessary being a reversal of the terminals of the source 19.

The present invention is principally directed to the D.-C. parameters of the circuit shown in Fig. 1, and hence, it is more easily understood with reference to Fig. 2 which is the D.-C. equivalent circuit diagram of the automatic gain control circuit shown in Fig. 1.

In accordance with the principles of the present invention, the gain of the transistor 21 is varied inversely as the strength of the signal being amplified thereby. The gain of transistor 21 is controlled by varying the operating point of the transistor 21. As illustrated, only the gain of transistor 21 is controlled, but any number of stages can be controlled if a greater amount of control is required.

The operating point of the transistor 25 is selected so that the transistor 25 is operated as a detector. The collector 43 is connected to the negative terminal of the source 19 by a conductor 45 to bias the collector 43 in the reverse direction. Forward bias current for the transistor 25 is supplied by a circuit including resistors 47, 49, and 51. Resistors 49 and 51 connect emitter 41 and base 39, respectively, to ground. Resistor 47 connects the base 39 to the negative terminal of the source 19. The values of the resistors 47, 49, and 51 relative to the magnitude of the voltage of source 19 are selected so that the transistor 25 is biased approximately to cutoff when no signal is applied. Thus, the positive halves of the input signal are clipped and only the negative half waves are transmitted by the transistor 25. Therefore, as mentioned above, the transistor 25 operates as a detector. Because of the detection action of transistor 25, the output signal thereof has two components, a D.-C. average value component and an A.-C. component. Since transistor 25 is a P–N–P transistor, D.-C. current flows through resistor 49 from point G toward point A, and as the signal strength increases point A becomes more negative relative to point G. Therefore, the only voltage that is developed between point A, at the emitter of transistor 25 and point G, shown as ground, is a D.-C. voltage having a magnitude that is approximately proportional to the magnitude of the signal being amplified by the transistor 25. This D.-C. voltage therefore has the desired characteristic of an automatic gain control signal. As shown, all of the A.-C. components of the signal are by-passed around the resistor 49 by a high-capacitance, low-impedance capacitor 53. However, if feedback of a portion of the A.-C. signal is desired, it is possible to bypass only a portion of the A.-C. signal around resistor 49.

The signal developed between points A and G must be applied to the stage whose gain is to be controlled with a polarity such that an increase in signal strength decreases the gain of the stage, if automatic gain control action is to be obtained. However, if volume expander action is desirable, the signal must be applied to the controlled stage with a polarity such that an increase in signal strength causes an increase in the gain of the controlled stage.

To obtain automatic gain control action, point G is connected to the emitter electrode of the transistor 11 through ground, as shown. Point A is connected to point B at the base electrode 27 of the transistor 21, by any suitable means, here shown as a high-frequency choke 55.

The circuit for utilizing the automatic gain control signal between points B and G is not, of itself, a part of the present invention. Such a circuit is more particularly described and claimed in a copending application of W. F. Chow, Serial No. 396,676, filed December 7, 1953, assigned to the assignee of the present invention.

The Chow circuit generally comprises means including a gain-control resistor 57 for connecting the collector electrode 31 of the transistor 21 to the source 19 to bias the collector 31 in the reverse direction. Suitable means, here shown as resistors 59 and 61, are connected to the source 19 to provide forward bias current for the emitter 29 relative to the base 25.

As mentioned above, when the signal strength increases, point A becomes more negative relative to point G. Stated in another way, point G becomes more positive with respect to point B. As described in the Chow application, this causes an increase in emitter current $\Delta I_2$. Because of the well-known properties of a transistor, this increase in emitter current appears at the collector 31 as $A\Delta I_2$, where A is a constant dependent on the physical characteristics of the transistor. This increase in current flowing through resistor 57 causes the collector voltage of the transistor 21 to decrease, thereby resulting in a decrease in gain. Therefore, the signal between points A and G, as applied to the transistor 21 has the proper direction of variation for an automatic gain control voltage, that is, the gain of the stage 11 is decreased when the signal strength increases. Since the present invention is concerned with the D.-C. parameters of an automatic gain control circuit, it operates equally well regardless of which electrode is employed as the common electrode for A.-C. signal purposes. Hence, other connections, such as a grounded-base or grounded-collector connection, may be employed, if desired.

In operation, a signal is received at terminals 17 from a source such as a radio-frequency amplifier stage (not shown). The signal is amplified by stages 11 and 13 and transmitted to transistor 25 where the signal is detected. A D.-C. signal is developed across resistor 49 whose magnitude is approximately proportional to the strength of the signal being amplified. This voltage is fed back through choke 55 to the base of the transistor 21, causing a change in the emitter current of the transistor 21. Assuming an increase in signal strength, the feedback voltage causes an increase in emitter current. This incremental increase in emitter current is amplified by the transistor 21 and appears at collector 31. This increase in current causes an increased voltage drop across resistor 57 thereby decreasing the gain of the transistor 21 and decreasing the magnitude of the output signal, the desired result of an automatic gain control voltage.

As mentioned above, an increase in received signal strength causes an increase in emitter current in the present automatic gain control circuit. This increase in current causes a second effect that is very desirable, namely, an automatic bandwidth control. As is well-known, an increase in emitter current of a transistor causes a decrease in input impedance of the stage being controlled. Since the input impedance is reduced, the tuned coupling circuits preceding the transistors 21 and 25 are shunted by a smaller effective resistance at a high input signal strength than at low signal strength. Thus, at high signal levels the bandwidth increases. Therefore, the bandwidth is automatically controlled in accordance with the strength of the signal received. This is desirable, because at low signal levels, corresponding to distant stations, the bandwidth is less, thereby lessening the possibility of interference from neighboring channels. At high signal strength, corresponding to local stations where no danger of interference exists, the bandwidth passed is greater, thereby taking advantage of the full spectrum radiated by the transmitter. By proper design of the coupling networks the relative bandwidths can be selected as desired. In an operative embodiment of the present invention, the audio bandwidth for low-strength signals was about four kilocycles while at strong-signal levels the audio bandwidth was about eight kilocycles.

While a specific embodiment has been shown and described, it will of course be understood that various modifications may yet be devised by those skilled in the art which will embody the principles of the invention and be found in the true spirit and scope thereof.

What is claimed is:

1. An automatic gain control circuit comprising first and second transistors each having base, emitter, and collector electrodes, means for applying a signal to be amplified to said first transistor, means for coupling the output signal of said first transistor to the input circuit of said second transistor, a source of direct voltage having first and second terminals, means connecting the collector electrode of said second transistor to said second terminal of said direct-voltage source to bias the collector electrode in the reverse direction, means for biasing said emitter electrode of said second transistor approximately to cutoff relative to said base electrode thereof, said emitter-biasing means including a resistor connected between said emitter electrode of said second transistor and said first terminal, means for bypassing A.-C. signals around said resistor, means including a gain control resistor connecting the collector electrode of said first transistor to said second terminal of said power supply to bias said collector electrode in the reverse direction, means for biasing said emitter electrode of said first transistor in the forward direction relative to the base thereof including means connecting said emitter electrode to said first terminal, and means providing a direct current path between the emitter electrode of said second transistor and the base electrode of said first transistor thereby to provide an automatic-gain-control voltage for said first transistor.

2. An automatic gain control circuit for a transistor amplifier comprising first and second junction transistors each having base, emitter, and collector electrodes, means for applying a signal to the input of said first transistor, means connecting said transistors in cascade to provide a signal path therebetween, a source of direct voltage having first and second terminals, means including a gain control resistor connected between said first terminal of said source of direct voltage and said collector electrode of said first transistor to bias said collector in the reverse direction, means connecting said emitter of said first transistor to said second terminal of said direct-voltage source, means for connecting the collector electrode of said second transistor to said first terminal of said direct voltage source, means for biasing said second transistor as a detector means connected to said collector electrode of said second transistor for deriving a detected signal therefrom, said biasing means including a parallel combination of resistance and capacitance connected between the emitter electrode of said second transistor and said second terminal of said direct voltage source for deriving a direct voltage approximately proportional to the magnitude of a signal being detected, and means connected between the base electrode of said first transistor and the emitter electrode of said second transistor for feeding back said derived potential to said first transistor thereby to cause an increase in emitter current of said first transistor, with an increase in magnitude of said derived signal and consequently causing an increased voltage drop across said gain-control resistor.

3. An automatic gain control circuit comprising first and second junction transistors each having base, emitter, and collector electrodes, means for applying a signal to the input of said first transistor, means connecting said first and second transistors in cascade to provide a signal path therebetween, a source of direct voltage having first and second terminals, means including a gain-control resistor connecting said collector electrode of said first transistor to said first terminal of said direct voltage source to bias said collector electrode in the reverse direction, means providing forward current bias for said emitter electrode of said first transistor relative to the base thereof and including means for connecting said emitter electrode of said first transistor to said second terminal of said direct voltage source, means connecting said collector electrode of said second transistor to said first terminal of the direct voltage source, means for biasing said emitter electrode of said second transistor approximately to cutoff relative to said base electrode thereof, said emitter-biasing means of said second transistor including a parallel combination of a resistor and a capacitor connected between said emitter of said second transistor and said second terminal of said direct voltage source to provide a direct voltage having a magnitude approximately proportional to the magnitude of a signal being amplified by said transistor, and means providing a direct-current path between the emitter electrode of said second transistor and said base electrode of said first transistor so that said derived voltage is fed back from said second transistor to said first transistor with a polarity to cause an increased voltage drop across said gain control resistor when said derived voltage increases in magnitude.

4. A biasing circuit for cascade-connected first and second transistors successively amplifying a signal applied to said first transistor, said transistors each having base, emitter, and collector electrodes, said biasing circuit comprising a source of direct voltage, means including a gain-control resistor connecting said collector electrode of said first transistor to said source of direct voltage to bias said collector in the reverse direction, means biasing said emitter electrode of said first transistor in the forward direction relative to said base electrode thereof, means connecting the collector electrode of said second transistor to said source of direct voltage to bias said collector of said second transistor in the reverse direction, means for biasing said emitter electrode of said second transistor relative to the base thereof so that said second transistor operates as a detector, means for deriving a detected signal from the collector of said second transistor, said emitter biasing means of said second transistor including means for deriving a direct voltage proportional to the magnitude of the signal being amplified, and means for feeding back said derived voltage from said second transistor to said first transistor with a polarity so that an increase in the magnitude of the derived signal voltage increases the voltage drop across said gain-control resistor, thereby to control the gain of said first transistor.

5. An automatic gain control circuit comprising first and second transistors connected in cascade and each having base, emitter, and collector electrodes, means for applying a signal to be amplified between the base and emitter electrodes of said first transistor, a source of direct voltage having first and second terminals, means connecting the collector electrode of said second transistor to said first terminal of said source to bias said collector in the reverse direction, means biasing said emitter electrode of said second transistor relative to said base electrode thereof so that said second transistor operates as a detector, means for deriving a detected signal from the collector electrode of said second transistor, said emitter biasing means including a parallel combination of a resistor and a capacitor connected between said emitter electrode of said second transistor and said second terminal of said direct voltage source, means including a gain-control resistor connecting the collector electrode of said first transistor to said first terminal of said direct voltage source to bias said collector electrode of said first transistor in the reverse direction, means for biasing said emitter electrode of said first transistor in the forward direction relative to the base electrode thereof, and means providing a direct current path between the base electrode of said first transistor and said emitter electrode of said second transistor.

6. An automatic gain control circuit comprising first and second junction transistors each having base, emitter, and collector electrodes, means for applying a signal to be amplified to said first transistor, means for coupling the output signal of said first transistor to input circuit of said second transistor, means for establishing current flow among the electrodes of said first and second transistors including means for biasing said emitter electrode of said second transistor approximately to cutoff relative to the base electrode thereof, means coupled to said first transistor for causing a substantial reduction in collector voltage and consequent reduction in gain upon an increase in emitter current in said transistor, means connected to the emitter electrode of said second transistor for deriving a direct current control signal having a magnitude approximately proportional to the magnitude of the signal being amplified by said second transistor, and means connected between the emitter electrode of said second transistor and the base electrode of said first transistor for feeding back said derived signal with a polarity so as to cause an increase in the emitter current of said first transistor when the magnitude of said derived signal increases.

References Cited in the file of this patent

UNITED STATES PATENTS

| | | |
|---|---|---|
| 1,869,331 | Ballantine | July 26, 1932 |
| 2,031,238 | Thompson | Feb. 18, 1936 |
| 2,644,914 | Kircher | July 7, 1953 |
| 2,652,460 | Wallace | Sept. 15, 1953 |

OTHER REFERENCES

Shea text, "Principles of Transistor Circuits," pages 132–134, 472, pub. September 15, 1953 by John Wiley & Sons, Inc., New York City.

"The Transistor," text pub. December 4, 1951 by Bell Tel. Laboratories, New York, pages 157, 158.

"The Transistor," text of record, add pp. 373, 402, 409.

Publication (3) "Automatic Gain Control of Junction Transistor Amplifiers" by Blecher; National Electric Conference, vol. 9, September 28–30, 1953 pages 731–737.